(12) United States Patent
Doyle et al.

(10) Patent No.: US 12,287,354 B2
(45) Date of Patent: *Apr. 29, 2025

(54) OSCILLOSCOPE PROBE HAVING PROBE IDENTIFICATION MODULE

(71) Applicant: Keysight Technologies, Inc., Santa Rosa, CA (US)

(72) Inventors: Paul Doyle, Colorado Springs, CO (US); Jeffrey John Haeffele, Monument, CO (US); Stephen B. Tursich, Peyton, CO (US); Edward Vernon Brush, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/571,746

(22) Filed: Jan. 10, 2022

(65) Prior Publication Data

US 2022/0128601 A1 Apr. 28, 2022

Related U.S. Application Data

(63) Continuation of application No. 16/173,070, filed on Oct. 29, 2018, now Pat. No. 11,287,445.

(51) Int. Cl.
*G01R 1/067* (2006.01)
*G01R 1/04* (2006.01)
*G01R 1/20* (2006.01)
*G06K 7/10* (2006.01)

(52) U.S. Cl.
CPC ....... *G01R 1/06788* (2013.01); *G01R 1/0416* (2013.01); *G01R 1/06766* (2013.01); *G01R 1/203* (2013.01); *G06K 7/10386* (2013.01)

(58) Field of Classification Search
CPC ...... G01R 1/0408; G01R 1/0416; G01R 1/06; G01R 1/067; G01R 1/06766; G01R 1/06788; G01R 1/20; G01R 1/203; G06K 7/10386

See application file for complete search history.

(56) References Cited

U.S. PATENT DOCUMENTS 3,594,715 A * 7/1971 Dumesnil ............. H01R 11/12
439/708
4,672,306 A   6/1987 Thong
5,691,635 A  11/1997 Pot et al.
(Continued)

FOREIGN PATENT DOCUMENTS

CN   103336935 B   8/2016

OTHER PUBLICATIONS

Notice of Allowance dated Feb. 2, 2022, for U.S. Appl. No. 16/173,070, 12 pgs.
(Continued)

*Primary Examiner* — Huy Q Phan
*Assistant Examiner* — David B Frederiksen

(57) ABSTRACT

An oscilloscope probe includes: a connector pod; a probe identification module disposed in the connector pod, the probe identification module having a cross-sectional area; and a resistor disposed in the connector pod, and in-line with the probe identification module and having a substantially identical cross-sectional area as the probe identification module.

20 Claims, 7 Drawing Sheets

(56) References Cited

U.S. PATENT DOCUMENTS

| | | | |
|---|---|---|---|
| 5,939,875 A | 8/1999 | Felps et al. | |
| 6,351,112 B1 | 2/2002 | Felps et al. | |
| 6,437,552 B1 | 8/2002 | Sekel et al. | |
| 6,468,100 B1* | 10/2002 | Meyer | H01R 24/542 |
| | | | 439/320 |
| 7,132,948 B2* | 11/2006 | Sweeney, II | G08B 13/2417 |
| | | | 343/893 |
| 7,294,995 B1 | 11/2007 | Stevens et al. | |
| 8,558,567 B2* | 10/2013 | Mutnury | G01R 31/2806 |
| | | | 324/754.01 |
| 9,188,606 B2 | 11/2015 | Johnson et al. | |
| 2004/0171935 A1 | 9/2004 | Van Creveld et al. | |
| 2005/0240369 A1* | 10/2005 | Diorio | G01R 35/005 |
| | | | 340/10.2 |
| 2006/0170555 A1* | 8/2006 | Sweeney, II | G08B 13/2417 |
| | | | 340/572.7 |
| 2007/0132583 A1* | 6/2007 | Sweeney | G06K 7/10336 |
| | | | 340/568.1 |
| 2007/0136036 A1 | 6/2007 | Sweeney, II et al. | |
| 2007/0257657 A1* | 11/2007 | Stevens | G01R 15/202 |
| | | | 324/72.5 |
| 2008/0238409 A1 | 10/2008 | Peschke | |
| 2010/0241116 A1 | 9/2010 | Beanmou et al. | |
| 2011/0279138 A1* | 11/2011 | Mutnury | G01R 31/2843 |
| | | | 324/763.01 |
| 2011/0304320 A1* | 12/2011 | Tien | G01R 1/06788 |
| | | | 324/121 R |
| 2012/0168518 A1 | 7/2012 | Baxter | |
| 2012/0262188 A1* | 10/2012 | Nickel | G01R 31/2822 |
| | | | 324/629 |
| 2013/0082695 A1* | 4/2013 | Johnson | G01R 15/207 |
| | | | 324/243 |
| 2013/0241710 A1 | 9/2013 | Hussain et al. | |
| 2014/0292477 A1 | 10/2014 | Ahmadloo | |
| 2014/0320153 A1* | 10/2014 | Johnson | G01R 1/06788 |
| | | | 324/713 |
| 2015/0094547 A1 | 4/2015 | Mickle et al. | |
| 2016/0135917 A1 | 5/2016 | Mickle et al. | |
| 2016/0220325 A1 | 8/2016 | Jeon et al. | |
| 2016/0233354 A1* | 8/2016 | Rayman | G01R 31/2896 |
| 2016/0299171 A1* | 10/2016 | Timm | G01R 1/0408 |
| 2017/0288357 A1* | 10/2017 | Price | B33Y 10/00 |

OTHER PUBLICATIONS

Chinese Notice to Grant dated Aug. 28, 2020 with English translation, 4 pgs.

* cited by examiner

OSCILLOSCOPE PROBE HAVING PROBE IDENTIFICATION MODULE

CROSS-REFERENCE TO RELATED APPLICATIONS

The present application is a continuation application under 37 C.F.R. § 1.53(b) of U.S. patent application Ser. No. 16/173,070 (now U.S. Pat. No. 11,287,445) filed on Oct. 29, 2018, naming Paul Doyle, et al. as inventors. Priority under 35 U.S.C. § 120 is claimed from U.S. patent application Ser. No. 16/173,070, and the entire disclosure of U.S. patent application Ser. No. 16/173,070 is specifically incorporated herein by reference.

BACKGROUND

An oscilloscope probe (alternately referred to herein as a 'probe') is used to transfer an electrical signal from a device under test (DUT) to an input of an oscilloscope which measures the electrical signal. Since a probe tip of the oscilloscope probe makes an electrical connection to the DUT, a high impedance should be presented at the probe tip so as not to load the electrical signal being measured. A bandwidth of a system that includes the oscilloscope probe should be larger than the electrical signal being measured to pass an accurate representation of the electrical signal to the oscilloscope. A typical oscilloscope probe includes a probe tip assembly, a length of probe cable, and a termination assembly that includes a connector. The probe tip assembly is connected to the length of probe cable.

Oscilloscope probe identification is used so that an oscilloscope "knows" what type of probe is plugged into each channel and then uses the correct settings for the type. In known probes, this identification is carried out using a fixed value resistor disposed in the probe. The oscilloscope is adapted to sense the value of the resistor, and to reference that value to a look-up table that identifies the type of probe based on the resistance value. However, the use of a resistor for probe identification is limited to general probe identification, and thus fails to provide any identifying probe data to the oscilloscope that are unique to the probe.

What is needed, therefore, is an oscilloscope probe that overcomes at least the shortcoming of known oscilloscope probes discussed above.

BRIEF DESCRIPTION OF THE DRAWINGS

The illustrative embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements throughout the drawings and written description.

DETAILED DESCRIPTION

Figure 1A:
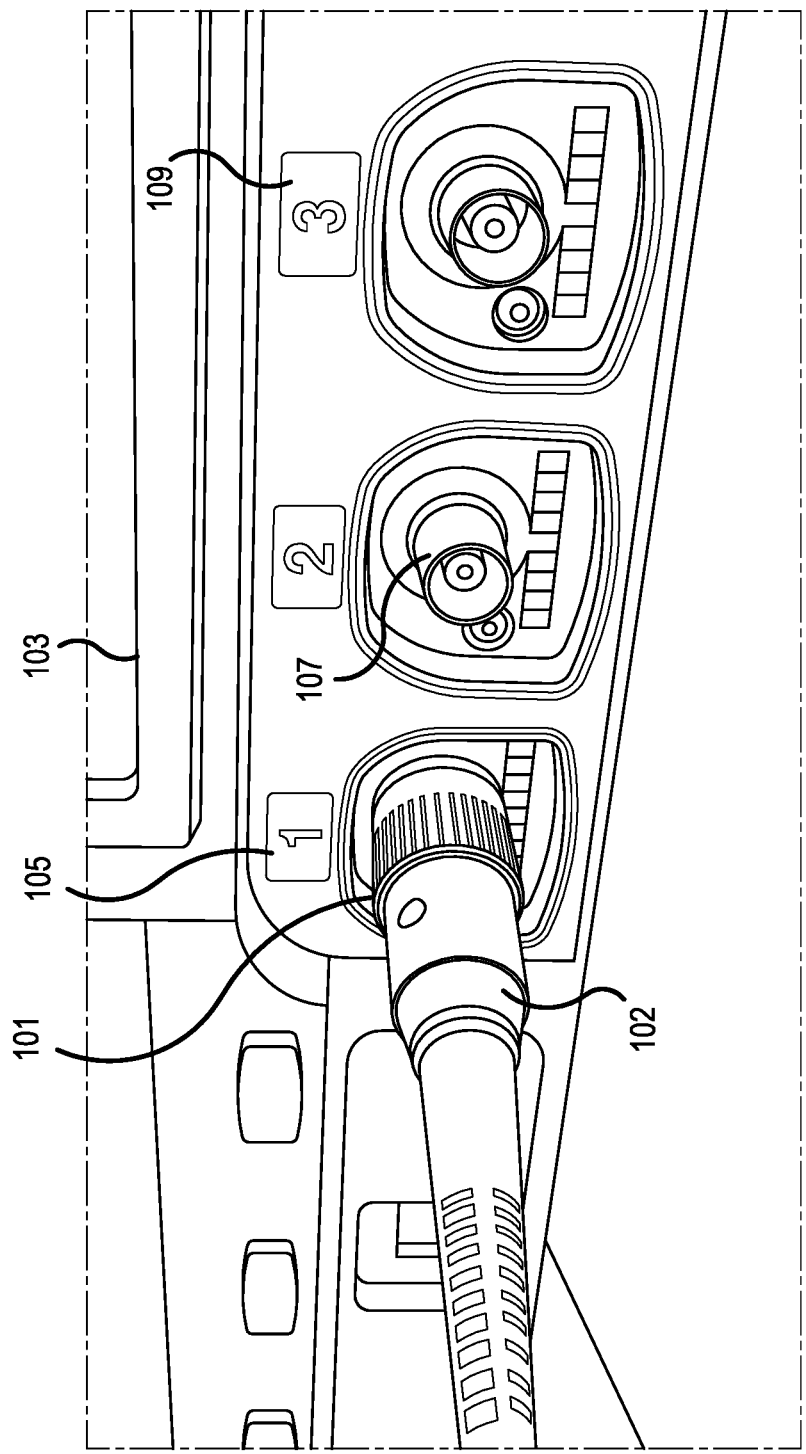
FIG. 1A is a perspective view of an oscilloscope probe connected to an oscilloscope in accordance with a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present teachings relate generally to oscilloscope probes that are configured to interface actively with an oscilloscope and, upon connection with the oscilloscope cause the oscilloscope to enter a read mode and read unique values and parameters that identify the type and functionality of the oscilloscope probe.

In accordance with a representative embodiment, an oscilloscope probe, comprises: a connector pod; a probe identification module, having a cross-sectional area, disposed in the connector pod; and a probe identification (ID) pin disposed in the connector pod, and in-line with the probe identification module and having a substantially identical cross-sectional area as the probe identification module In accordance with another representative embodiment, an oscilloscope probe, comprises: a connector pod; and a radio-frequency identification (RFID) tag comprising an integrated circuit and an antenna disposed in the connector pod. The RFID tag is configured to identify the oscilloscope probe.

FIG. 1A is a perspective view of an oscilloscope probe 101 comprising a connector pod 102 in accordance with a representative embodiment. As will become clearer as the present description continues, the oscilloscope probe 101 includes one of a probe identification module, or an RFID tag. Beneficially, the probe identification module or RFID tag are configured to be disposed within the envelope or profile of the connector pod 102 of the oscilloscope probe 101. Stated somewhat differently, the oscilloscope probe 101 has a cross-sectional area (in the x-y plane of FIG. 1A). As described more fully below, a probe identification (ID) pin (not shown in FIG. 1A) is disposed in the envelope or profile of the connector pod 102 of the oscilloscope probe 101. This probe ID pin has a cross-sectional area (illustratively a circle in the x-y plane). According to representative embodiments of the present teachings, the probe identification module disposed in the envelope or profile of the connector pod 102 of the oscilloscope probe 101 has a substantially identical cross-sectional area as the probe ID pin.

As shown, the oscilloscope probe 101 is electrically and mechanically connected to a first port 105 of an oscilloscope 103. Other probes, including another oscilloscope probe in accordance with the present teachings can be connected to a second port 107 and/or a third port 109 of the oscilloscope 103.

The electrical and mechanical connections of the oscilloscope probe 101 are effected using a known electrical connector (not shown) that is adapted to mate with the electrical connector of the first port 105. In accordance with a representative embodiment, the electrical connector is a Bayonet Neill-Concelman (BNC) connector or a mini BNC connector. It is emphasized that the use of a BNC connector is merely illustrative, and other known electrical connectors can be used to effect the electrical and mechanical connection of the oscilloscope probe 101.

Figure 1B:
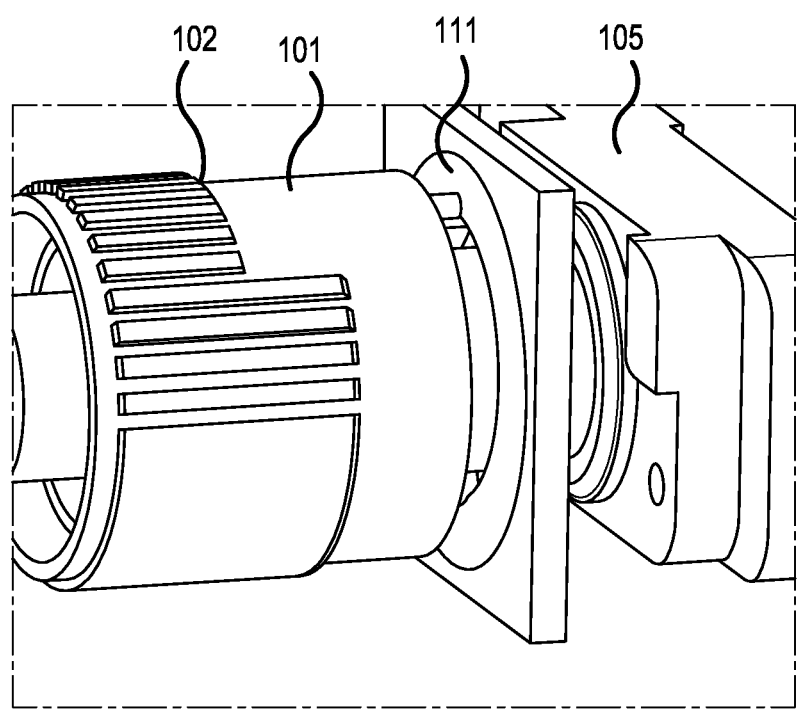
FIG. 1B is a perspective view of a portion of the oscilloscope probe of FIG. 1A in accordance with a representative embodiment

FIG. 1B is a perspective view of components of the oscilloscope probe 101 and connector pod 102 of FIG. 1A in accordance with a representative embodiment. As shown, the oscilloscope probe 101 is connected to the first port 105, and connects electrically not only to the first port 105, but also with an ID ring 111 disposed between the first port 105 and the mating surfaces (not shown in FIG. 1B) of the oscilloscope probe 101. As described more fully below, the ID ring 111 is illustratively an integrated circuit disposed on a circuit board. Upon electrical connection of the oscilloscope probe 101 to the ID ring 111, the circuitry of the ID ring 111 provides a voltage to the resistor and the probe identification module allowing the value of the resistance to be determined. Moreover, and as described more fully below, the voltage provided by the ID ring 111 allows the ID ring to read memory (e.g., Electrically Erasable Programmable Read-Only Memory (EEPROM)) disposed in the probe identification module. As described more fully below, the resistance of the resistor identifies the oscilloscope probe 101 as having a probe identification module or not. In the former case, based on the resistance value, the ID ring 111 then reads the memory of the oscilloscope probe 101, which provides a unique identification number and other characteristic values of the oscilloscope probe 101. In the case of the latter, legacy devices are identified by the ID ring 111 through the determination of the type (model) of the oscilloscope probe 101. Stated somewhat differently, as described more fully below, the ID ring 111 is configured to switch from a resistor sensing-only mode, to a mode that it will provide a small charge to the EEPROM disposed in the probe ID module by way of the same circuit path it used for resistor sensing. Once the EEPROM has the appropriate charge provided the oscilloscope 103, via the ID ring 111, will then switch to a read mode and read the unique values that are stored in the EEPROM. The oscilloscope 103 will then use that information and combine it with any compensation values found during the probe compensation process and enable it to recall the combination of the two. So, each time the oscilloscope 103 reads the unique probe identification data it will then recall the compensation data, combine these data and set the oscilloscope settings for that channel and probe combination accordingly.

Figure 1C:
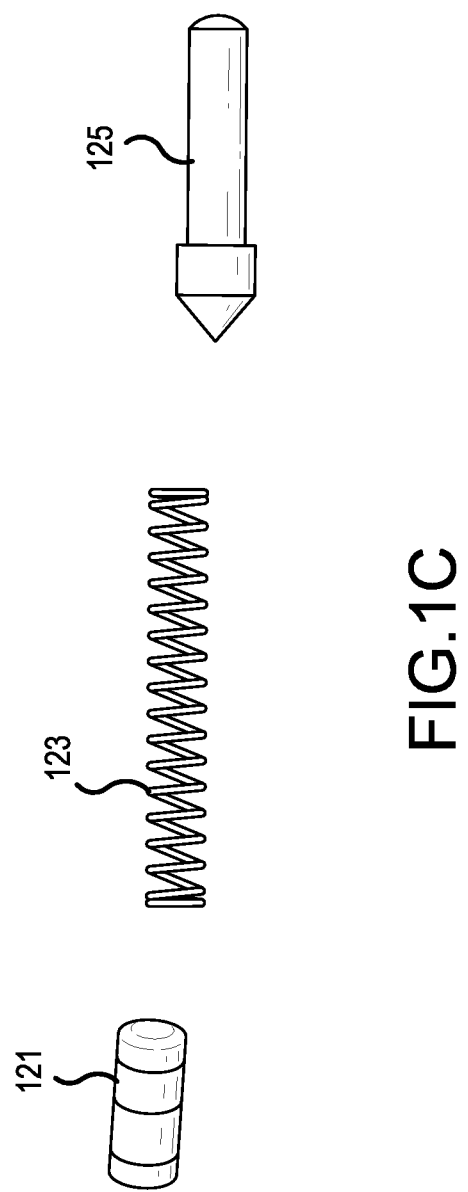
FIG. 1C is a perspective view of components of the oscilloscope probe of FIG. 1A in accordance with a representative embodiment.

FIG. 1C is a perspective view of components of the oscilloscope probe of FIG. 1A in accordance with a representative embodiment.

The oscilloscope probe 101 comprises a probe identification module 121, a spring 123 and a probe ID pin 125. As described more fully below, the probe identification module comprises an EEPROM or other suitable memory (not shown in FIG. 1C), and a resistor (not shown in FIG. 1C). The probe identification module 121 is connected to the probe ID pin 125 by the spring 123. The probe ID pin 125 is configured to connect the probe identification module 121 to the ID ring (not shown in FIG. 1C) upon mating of the probe identification module 121 with the oscilloscope (not shown in FIG. 1C).

According to representative embodiments of the present teachings, the probe identification module 121 disposed in the envelope or profile of the connector pod 102 of the oscilloscope probe 101 has a substantially identical cross-sectional area as the probe ID pin 125. Similarly, the probe identification module 121 disposed in the envelope or profile of the connector pod 102 of the oscilloscope probe 101 has a substantially identical cross-sectional area as the spring 123. As will be appreciated, the comparatively compact structure provided by the probe identification module 121 requires no more space than known legacy devices, which include only a resistor. As such, the probe identification module 121 fits within the envelope or profile of the connector pod 102 of the oscilloscope probe 101, which has substantially the same dimensions as known oscilloscope probes (not shown) having only resistors for oscilloscope probe identification (so-called legacy oscilloscope probes).

Figure 1D:
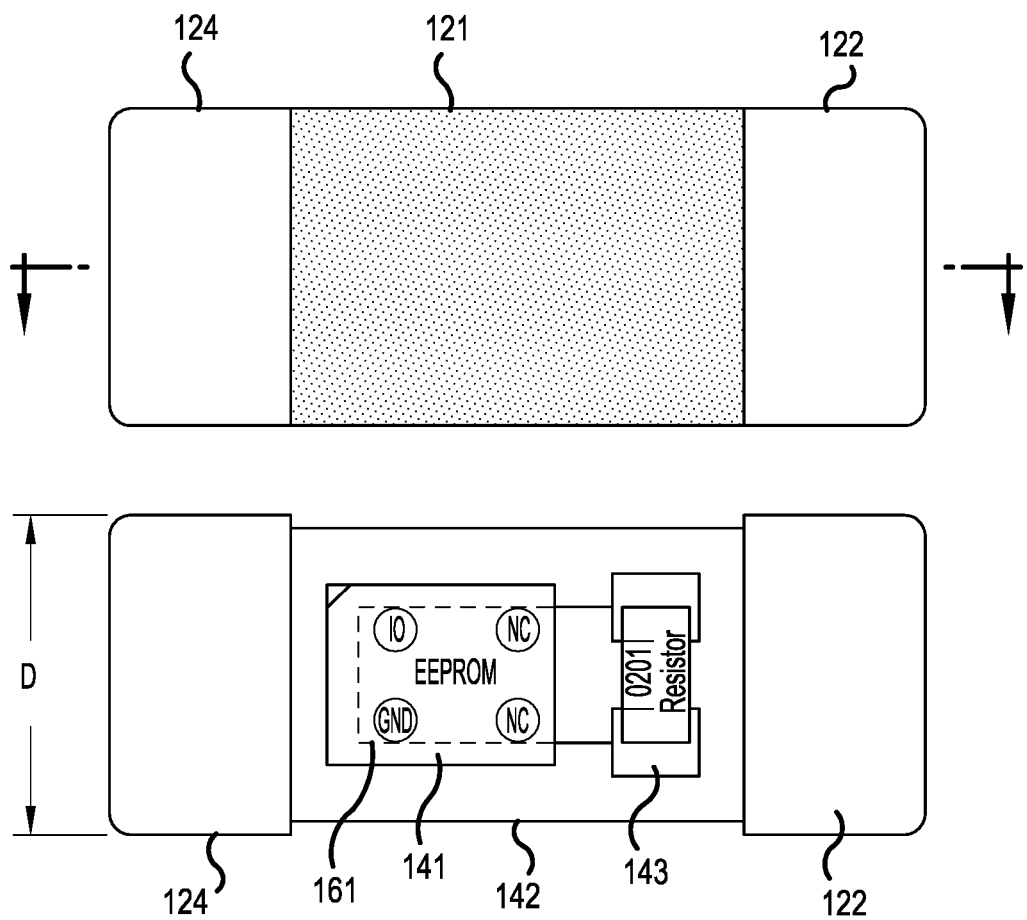
FIG. 1D shows a perspective view and a cross-sectional view of the probe ID module in accordance with a representative embodiment.

FIG. 1D shows a perspective view and a cross-sectional view of the probe identification module 121 in accordance with a representative embodiment.

The probe identification module 121 includes an EEPROM 141 or similar memory disposed over a substrate 142. The probe identification module 121 also comprises a resistor 143 disposed over the substrate 142. Finally, the probe identification module 121 includes an electrically conductive signal cap 122, which electrically contacts the probe ID pin (not shown in FIG. 1D); and an electrically conductive ground cap 124 which connects to a ground contact of an electrical connector (not shown in FIG. 1D).

As noted above, and as explained more fully below, the voltage applied from the ID ring 111 to the EEPROM 141 via the connection of the probe ID pin 125 to the electrically conductive signal cap 122 of the probe identification module 121 causes the EEPROM 141 to transmit a unique identification number and other characteristic values of the oscilloscope probe 101. Such characteristic values may include, but are not limited to, a probe attenuation factor, a bandwidth, an impedance, a frequency compensation, calibration factors, a serial number, and a manufacturing date. Similarly, the voltage applied to the resistor 143 allows the ID ring to determine the resistance value, and based on this information the oscilloscope 103 can determine that the oscilloscope probe 101 includes an EEPROM 141 (or other memory) and the procedure of obtaining the identifying information of the oscilloscope probe 101 begins.

In the presently describe embodiment, the probe identification module 121 is substantially cylindrical in shape, and has an overall displacement that is selected to be approximately the same as the displacement of resistors used in identification of known oscilloscope probes. Generally, the probe identification module 121 has a diameter "D" that is substantially the same as the diameter of the spring 123, and substantially the same as the diameter of the probe ID pin 125. As such, according to representative embodiments of the present teachings, the probe identification module 121 disposed in the envelope or profile of the connector pod 102 of the oscilloscope probe 101 has a substantially identical cross-sectional area as the probe ID pin 125, and therefore the envelope or profile of the oscilloscope probe 101 is substantially the same displacement as known oscilloscope probes that comprise only an identification resistor.

Figure 1E:
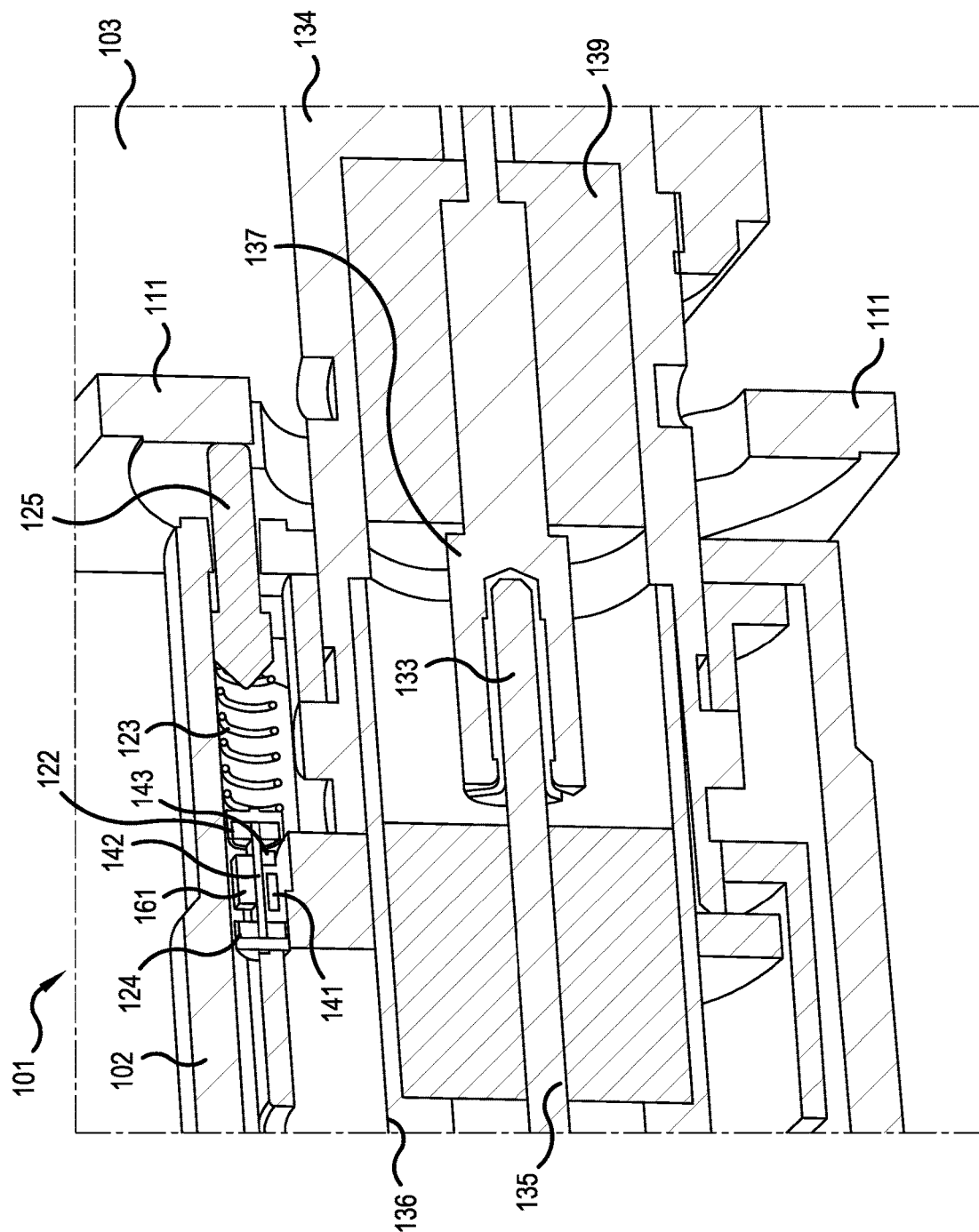
FIG. 1E is a cross-sectional view of the oscilloscope probe of FIG. 1A in accordance with a representative embodiment.

FIG. 1E is a cross-sectional view of the oscilloscope probe 101 of FIG. 1A connected to an oscilloscope, in accordance with a representative embodiment. Various components and aspects of the oscilloscope probe 101 described above in connection with the representative embodiments depicted in FIGS. 1A-1D are common to those of the presently described oscilloscope probe 101. Details of these common components and aspects may not be repeated to avoid obscuring the presently described embodiments.

Referring to FIG. 1E, the oscilloscope probe 101 is shown connected to the oscilloscope 103. To this end, the probe ID pin 125 is in electrical contact with the ID ring 111, and a male contact 133 of an electrical connector 135 is mated with a female contact 137 of an electrical connector 139 of the oscilloscope 103. As can be seen in FIG. 1, a ground barrel 134 mates with a ground barrel 136 of the electrical connector 135. Notably, the ground barrel 136 is also in electrical contact with the electrically conductive ground cap 124 of the probe identification module 121.

The EEPROM 141 is disposed over a circuit board (or other useful substrate) 142 in the probe identification module 121. A resistor 143 is also disposed on the circuit board 142 as shown. Upon connection of the probe ID PIN 125 with the ID ring 111, a voltage is provided to the EEPROM 141 and the resistor 143. As noted above, and as explained more fully below, the voltage applied from the ID ring 111 to the EEPROM 141 causes the EEPROM 141 to transmit a unique identification number and other characteristic values of the oscilloscope probe 101 as noted above. Similarly, the voltage applied to the resistor 143 allows the ID ring to determine the resistance value, and based on this information the oscilloscope 103 can determine that the oscilloscope probe 101 includes an EEPROM 141 (or other memory) and the procedure of obtaining the identifying information of the oscilloscope probe 101 begins. Stated somewhat differently, the ID ring 111 is configured to switch from a resistor sensing-only mode (i.e., a legacy oscilloscope probe (not shown)), to a mode that it will provide a small voltage to the EEPROM 141 disposed in the probe identification module 121 by way of the same circuit path it used for resistor sensing (i.e., the connection with the ID ring 111 via the probe ID pin 125). Once the EEPROM 141 has the appropriate charge provided the oscilloscope 103, via the ID ring 111, will then switch to a read mode and read the unique values that are stored in the EEPROM 141. The oscilloscope 103 will then use that information and combine it with any compensation values found during the probe compensation process and enable it to recall the combination of the two. So, each time the oscilloscope 103 reads the unique probe identification data it will then recall the compensation data, combine these data and set the oscilloscope settings for that channel and probe combination accordingly.

Figure 1F:
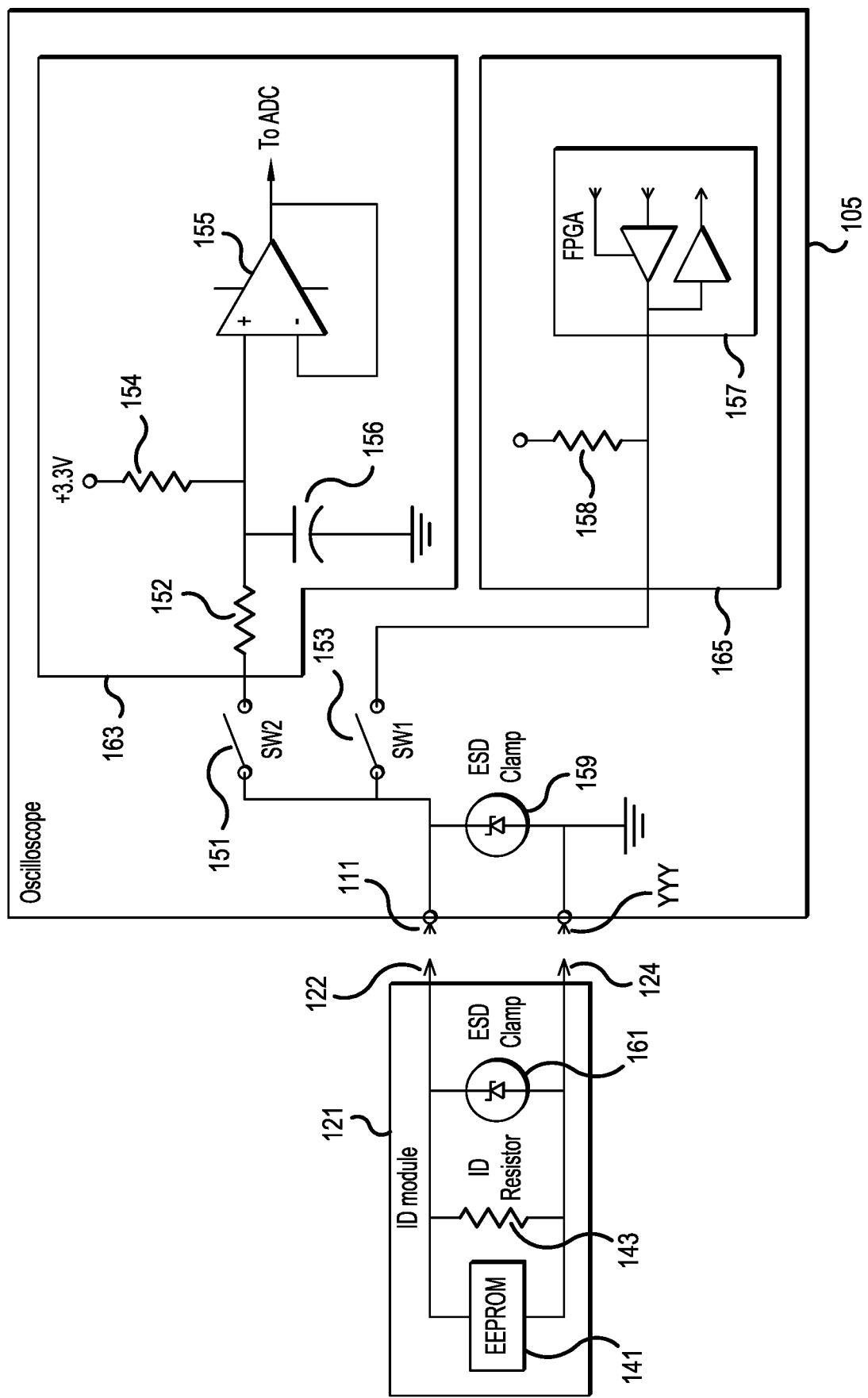
FIG. 1F is a simplified schematic circuit diagram of the oscilloscope probe and circuit components of an oscilloscope in accordance with a representative embodiment.

FIG. 1F is a simplified schematic circuit diagram of the oscilloscope probe 101 and circuit components of an oscilloscope in accordance with a representative embodiment.

Various components and aspects of the oscilloscope probe 101 described above in connection with the representative embodiments depicted in FIGS. 1A-1E are common to those of the presently described oscilloscope probe 101. Details of these common components and aspects may not be repeated to avoid obscuring the presently described embodiments.

Referring to FIG. 1F, oscilloscope probe includes an EEPROM 141 connected electrically in parallel with resistor 143 and an optional protective diode 161. The ID ring 111 comprises a first switch 151 connected to a resistor sense circuit 163. The ID ring 111 also comprises a second switch 153 connected to a logic device 157 such as a field programmable gate array (FPGA) or application specific integrated circuit (ASIC). Electrical connection is made by electrical contact between the oscilloscope probe 101 and the ID ring 111. This connection is a schematic representation of the connection of the electrically conductive signal cap 122 and the electrically conductive ground cap 124 of the oscilloscope probe 101 with the probe ID pin 125, and the with the ID ring 111. The resistor sense circuit 163 is illustratively an ohmmeter, configured to measure the resistance of the input to ground, and is useful in identifying whether a legacy probe or a probe in keeping with present teachings is connected to the first port 105 of the oscilloscope 103. A resistor 152 serves as a current limit and can aid in setting the input resistance range. A resistor 154 is a resistor divider and aids in setting the input range of the signal into an amplifier 155, which buffers the voltage into the ADC. Finally, the resistor sense circuit 153 comprises a capacitor 156 that filters the voltage to prevent high frequencies from reaching the input to the amplifier 155.

An EEPROM communications circuit 165 comprises the logic device 157, which is illustratively an FPGA. The EEPROM communications circuit 165 functions as a digital input/output (I/O), and is configured to read and write to the EEPROM 141. A pull-up resistor 158 enables the EEPROM communications circuit 165 to be an open-drain (or open-collector) without the need to actively drive a high voltage.

The logic device 157 is configured as an input when reading from the EEPROM 141 or as an output when writing to the EEPROM 141.

Figure 2:
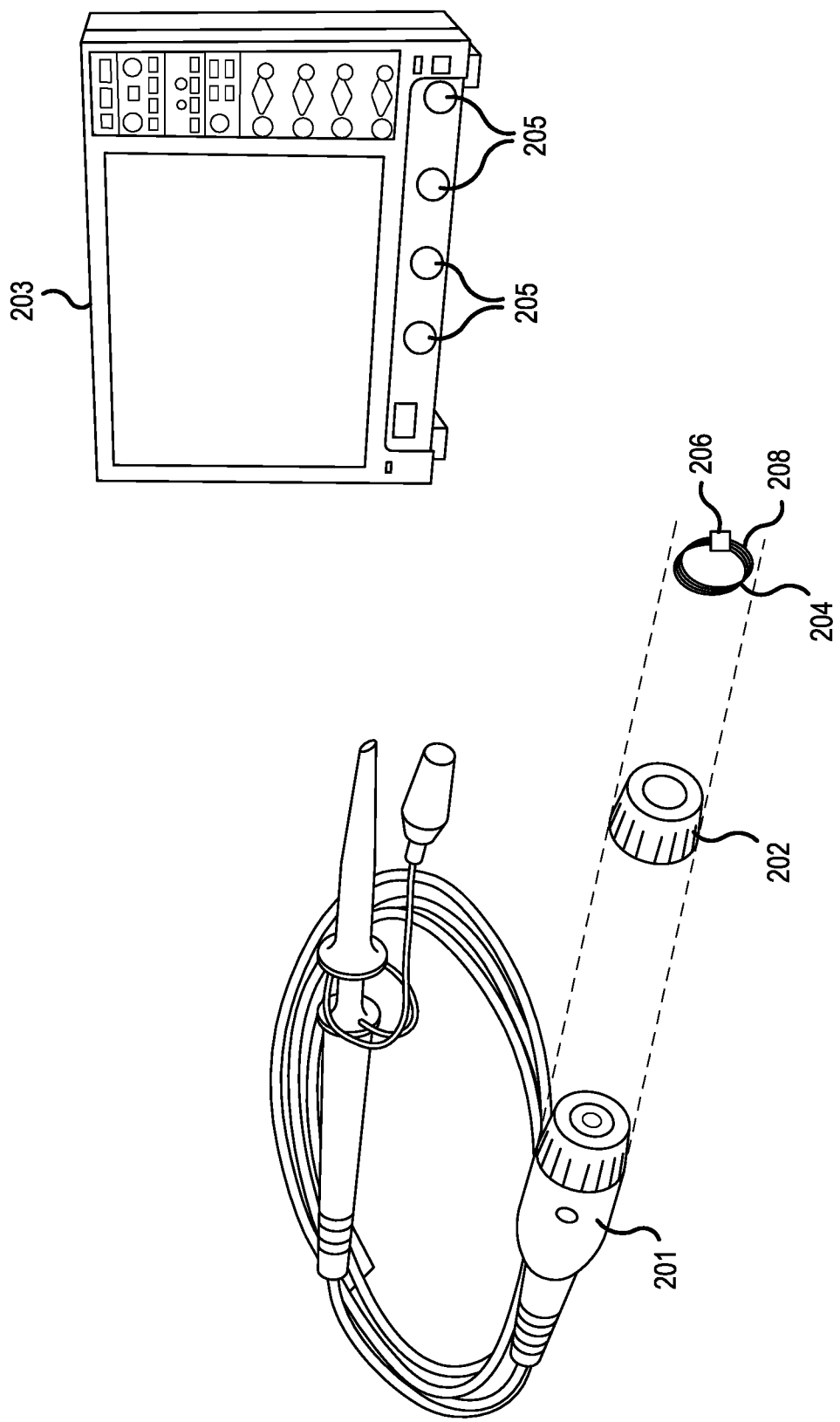
FIG. 2 is an exploded view of an oscilloscope probe in accordance with a representative embodiment.

FIG. 2 is an exploded view of an oscilloscope probe 201 in accordance with a representative embodiment.

Various components and aspects of the oscilloscope probe 201 described above in connection with the representative embodiments depicted in FIGS. 1A-1F are common to those of the presently described oscilloscope probe 201. Details of these common components and aspects may not be repeated to avoid obscuring the presently described embodiments.

As depicted in FIG. 2, a cowling 202 is configured to be disposed over an end of the oscilloscope probe 201. A radio frequency identification (RFID) tag 204 comprises an antenna 208 and an RFID integrated circuit (IC) 206, which are configured to be disposed within the cowling 202. As will be appreciated, in addition to the necessary RF transceiver circuitry (not shown) needed to effect two-way communication, the RFID IC 206 has a memory (not shown), which stores identifying information of the oscilloscope probe 201, such as described previously. Illustratively, the memory may be one of a number of types of memory, such as a read-only memory (ROM) or EEPROM, such as described above.

An oscilloscope 203 is adapted to connect to the oscilloscope probe 201 via one or more RFID tag readers 205. As is known to one of ordinary skill in the art, the RFID tag readers 205 have antennae, and are adapted to send and receive data to and from the RFID tag 204. The transmission and reception of data between the RFID IC 206 and the RFID tag readers 205 may be effected using one of a number of known communications protocols. By way of example, the transmission and reception of data between the RFID tag 204 and the RFID tag readers 205 may use industry standards NFC Forum Type 2, ISO/IEC14443, or other suitable method.

Upon initialization, communications are established between one of the RFID tag readers 205 and the RFID tag 204 via respective antennae. After initialization, the RFID tag reader 205 receives a unique identification number and other characteristic values of the oscilloscope probe 201.

The RFID system comprising the RFID tag 204, and the RFID tag reader 205 to which the oscilloscope probe 201 is connected, will not only identify for the oscilloscope 203 the type of probe, but also will store and communicate unique data that is specific to each oscilloscope probe.

The oscilloscope 203 will use that information gathered from the RFID tag 204, and will combine this information with any compensation values found during the probe compensation process and enable the respective RFID tag reader 205 to which the RFID tag 204 is connected to recall the combination of the RFID tag 204 and the RFID tag reader 205. So, each time the oscilloscope 203 reads the unique probe identification data it will then recall the compensation data, combine them and set the oscilloscope settings for that channel and probe combination accordingly.

In addition to providing probe identification, the RFID system of the representative embodiments can be used for other bi-directional communication such as controlling settings within the probe itself (e.g.—gain, offset, etc.) or notifying the scope of operating conditions (e.g.—overtemp, overvoltage, etc.). Some of these circuits could also be powered by the RFID system thus eliminating the need for additional scope/probe connections.

In view of the foregoing, the present disclosure, through one or more of its various aspects, embodiments and/or specific features or sub-components, is thus intended to bring out one or more of the advantages as specifically noted below. For purposes of explanation and not limitation, representative embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted to not obscure the description of the example embodiments. Such methods and apparatuses are within the scope of the present disclosure.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents and shall not be restricted or limited by the foregoing detailed description.

The invention claimed is:

1. An oscilloscope, comprising:
a radiofrequency identification (RFID) reader adapted to connect to an oscilloscope probe, comprising: a connector pod; an RFID tag comprising an integrated circuit and an antenna disposed in the connector pod, the RFID tag being configured to identify the oscilloscope probe, wherein an electrical signal causes the RFID tag to provide unique identification values of the oscilloscope probe comprising one or more of a probe attenuation factor, a bandwidth, an impedance, a frequency compensation, and calibration factors, which are stored in a memory, to the oscilloscope; and a spring disposed in the connector pod between the RFID tag and an electrical contact of the oscilloscope probe, wherein the spring has a cross-sectional area that is substantially the same as the cross-sectional area as the RFID tag, and a resistor.

2. The oscilloscope of claim 1, wherein the integrated circuit comprises a memory.

3. The oscilloscope of claim 2, wherein the memory comprises an electrically erasable programmable memory (EEPROM).

4. The oscilloscope of claim 2, wherein the RFID tag is configured to receive a signal from the RFID reader, and to transmit information from the oscilloscope probe to the oscilloscope.

5. The oscilloscope of claim 1, wherein the electrical signal is received from a circuit board disposed on the oscilloscope.

6. The oscilloscope of claim 1, wherein a value of a resistance of a resistor is chosen to identify a presence of the RFID tag.

7. An oscilloscope, comprising:
a radio frequency identification (RFID) reader adapted to connect to an oscilloscope probe, which comprises: a connector pod; a probe identification module disposed in the connector pod, the probe identification module having a cross-sectional area; a probe identification (ID) pin disposed in the connector pod, and in-line with the probe identification module and having a substantially identical cross-sectional area as the probe identification module; and a spring disposed in the connector pod between the probe identification module and an electrical contact of the oscilloscope probe, wherein the spring has a cross-sectional area that is substantially the same as the cross-sectional area as the probe identification module.

8. The oscilloscope of claim 7, wherein the probe identification module comprises a circuit board comprising a memory.

9. The oscilloscope of claim 8, wherein the memory comprises an electrically erasable programmable memory (EEPROM).

10. The oscilloscope of claim 9, further comprising an electrical connector configured to electrically connect the oscilloscope probe to the oscilloscope; and a circuit disposed between the EEPROM and the electrical connector.

11. The oscilloscope of claim 10, wherein an electrical signal is provided to the EEPROM, the electrical signal configured to cause the EEPROM to provide unique identification values to the oscilloscope.

12. The oscilloscope probe of claim 11, wherein the unique identification values comprise a probe type, a serial number of the oscilloscope probe, and parametric information of the oscilloscope probe.

13. An oscilloscope probe, comprising:
a cowling disposed over an end of the oscilloscope probe; and
a radio frequency identification (RFID) tag comprising an antenna and an RFID integrated circuit (IC) disposed within the cowling.

14. The oscilloscope probe of claim 13, wherein the RFID IC further comprises RF transceiver circuitry to effect two-way communication.

15. The oscilloscope probe of claim 13, further comprises a memory.

16. The oscilloscope probe of claim 13, wherein the RFID tag is adapted to establish communications with an RFID tag reader of an oscilloscope via the antenna and an antenna of the RFID tag reader.

17. The oscilloscope probe of claim 16, wherein after an initialization, the RFID tag reader receives a unique identification number and other characteristic values of the oscilloscope probe.

18. The oscilloscope probe of claim 17, wherein the RFID tag reader is adapted to communicate unique identification number data that is specific to the oscilloscope probe.

19. The oscilloscope probe of claim 18, wherein the oscilloscope is adapted to combine the unique identification number with compensation values found during a probe compensation process and enable the RFID tag reader to which the RFID tag is connected to recall the combination of the RFID tag and the RFID tag reader.

20. The oscilloscope probe of claim 19, wherein the oscilloscope probe is adapted to be disconnected and reconnected to the oscilloscope, and when reconnected, the oscilloscope reads the unique identification number and other characteristic values of the oscilloscope probe, and is adapted to recall compensation data, and set settings of oscilloscope settings for a channel and probe combination.

* * * * *